US008334590B1

(12) United States Patent
Jung et al.

(10) Patent No.: US 8,334,590 B1
(45) Date of Patent: Dec. 18, 2012

(54) SEMICONDUCTOR DEVICE HAVING INSULATING AND INTERCONNECTION LAYERS

(75) Inventors: Yoon Ha Jung, Kyunggi-do (KR); Kyu Won Lee, Seoul (KR); Chan Yok Park, Seoul (KR)

(73) Assignee: Amkor Technology, Inc., Chandler, AZ (US)

( * ) Notice: Subject to any disclaimer, the term of this patent is extended or adjusted under 35 U.S.C. 154(b) by 373 days.

(21) Appl. No.: 12/204,692

(22) Filed: Sep. 4, 2008

(51) Int. Cl.
 *H01L 23/04* (2006.01)
(52) U.S. Cl. ........ 257/698; 257/778; 257/783; 257/786; 438/108; 438/127
(58) Field of Classification Search .................. 257/678, 257/685, 686, 723, 773, 774, 776, 777, 778, 257/787, 790, 690, 687, 788, 789, 791, 792, 257/793, 794, 795, 780, 781, 782, 783, 784, 257/786, 698; 438/108, 109, 110, 125, 126, 438/127, 106, 107, 612, 613, 614, 618; 174/260, 174/261, 262; 361/760, 761, 762, 763, 764, 361/794, 795
See application file for complete search history.

(56) References Cited

U.S. PATENT DOCUMENTS

| 5,151,769 | A | 9/1992 | Immorlica, Jr. et al. |
| 6,441,498 | B1 | 8/2002 | Song |
| 6,507,119 | B2 | 1/2003 | Huang et al. |
| 6,682,957 | B2 | 1/2004 | Song |
| 6,847,115 | B2 | 1/2005 | Crane, Jr. et al. |
| 6,909,054 | B2 * | 6/2005 | Sakamoto et al. ............ 174/260 |
| 7,045,391 | B2 | 5/2006 | Lin |
| 7,154,189 | B2 * | 12/2006 | Maeda et al. ................. 257/787 |
| 7,269,899 | B2 | 9/2007 | Brist et al. |
| 7,338,892 | B2 | 3/2008 | Wang et al. |
| 8,053,681 | B2 | 11/2011 | Jung et al. |
| 2002/0117743 | A1 * | 8/2002 | Nakatani et al. ............... 257/687 |
| 2006/0076671 | A1 * | 4/2006 | Kariya et al. .................. 257/702 |
| 2006/0145328 | A1 * | 7/2006 | Hsu ................................ 257/690 |
| 2007/0056766 | A1 * | 3/2007 | Sunohara ....................... 174/260 |
| 2007/0084628 | A1 * | 4/2007 | Chang et al. ................... 174/260 |
| 2007/0119617 | A1 * | 5/2007 | Hayashi et al. ................ 174/260 |
| 2007/0284711 | A1 | 12/2007 | Lee et al. |
| 2008/0007927 | A1 | 1/2008 | Ito et al. |
| 2009/0085190 | A1 * | 4/2009 | Simon et al. ................... 257/698 |

FOREIGN PATENT DOCUMENTS

JP          11-174174        7/1999

OTHER PUBLICATIONS

Huemoeller et al., "Shielded Embedded Electronic Component Substrate Fabrication Method and Structure", U.S. Appl. No. 12/569,300, filed Sep. 29, 2009.

* cited by examiner

*Primary Examiner* — Ha Nguyen
*Assistant Examiner* — Thanh Y Tran
(74) *Attorney, Agent, or Firm* — McKay and Hodgson, LLP; Serge J. Hodgson (57) ABSTRACT

A semiconductor device for use in a printed circuit board is provided. In the semiconductor device, metal pillars are disposed perpendicular to bond pads of a semiconductor die. This configuration eliminates the need to form via holes for the connection of interconnection layers and the bond pads of the semiconductor die, thus simplifying the fabrication procedure of the semiconductor device. In addition, the semiconductor die is embedded in the semiconductor device. Based on this configuration, the use of the semiconductor device in a printed circuit board facilitates the stacking of a plurality of semiconductor dies and can reduce the thickness required for the stack, which make the semiconductor device light in weight and small in thickness and size.

16 Claims, 13 Drawing Sheets

SEMICONDUCTOR DEVICE HAVING INSULATING AND INTERCONNECTION LAYERS

BACKGROUND OF THE INVENTION

1. Field of the Invention

The present invention relates to a semiconductor device constituting a printed circuit board and a method for fabricating the semiconductor device.

2. Description of the Related Art

A printed circuit board (PCB) generally refers to a plate in which interconnection lines are pre-patterned on a board made of an insulating material. Devices are formed on a printed circuit board and are only connected to interconnection lines of the printed circuit board in the manufacture of a product. Printed circuit boards are currently used in various fields due to their convenience of use.

Products presently used in various fields are required to be not only reduced in size but also have diverse functions. To comply with these requirements, semiconductor devices included in products are also required to be light in weight and small in thickness and size. Under these circumstances, techniques have been developed for the stacking of semiconductor dies within semiconductor packages and have great utility in many applications.

In line with recent trends towards miniaturization of semiconductor packages, efforts have also been made to develop lightweight, thin and small-sized printed circuit boards on which semiconductor packages are mounted. The relative proportion of a printed circuit board in a product increases with decreasing size of semiconductor packages. In view of this situation, techniques have been developed for mounting semiconductor dies within printed circuit boards to achieve further reduction in the overall size of semiconductor devices. Bond pads of semiconductor dies must be electrically connected to interconnection patterns of a printed circuit board in order to mount the semiconductor dies within the printed circuit board. Therefore, after semiconductor dies are surrounded by insulating members, it is necessary to form via holes in order to expose bond pads of the semiconductor dies. An impact is applied to semiconductor dies during formation of via holes, thus posing a danger of damage to the semiconductor dies. Further, bond pads of semiconductor dies are not precisely aligned with interconnection patterns of a printed circuit board, resulting in frequent electrical failures.

BRIEF SUMMARY OF THE INVENTION

A semiconductor device for use in a printed circuit board is provided. In the semiconductor device, metal pillars are disposed perpendicular to bond pads of a semiconductor die. This configuration eliminates the need to form via holes for the connection of interconnection layers and the bond pads of the semiconductor die, thus simplifying the fabrication procedure of the semiconductor device. In addition, the semiconductor die is embedded in the semiconductor device. Based on this configuration, the use of the semiconductor device in a printed circuit board facilitates the stacking of a plurality of semiconductor dies and can reduce the thickness required for the stack, which make the semiconductor device light in weight and small in thickness and size.

The present invention will be more apparent from the following detailed description taken in conjunction with the accompanying drawings.

BRIEF DESCRIPTION OF THE DRAWINGS

Common reference numerals are used throughout the drawings and the detailed description to indicate the same elements.

DETAILED DESCRIPTION OF THE INVENTION

Figure 1:
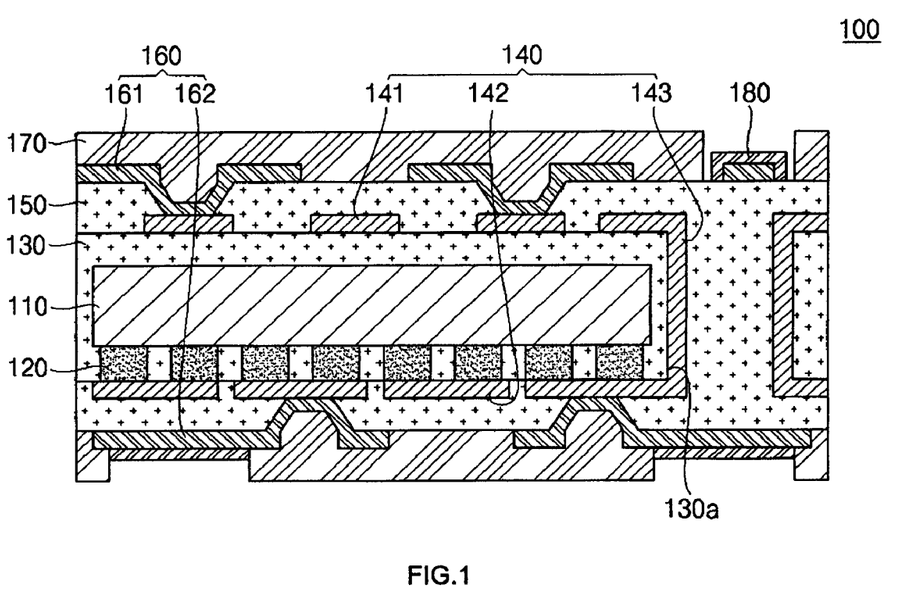
FIG. 1 is a cross-sectional view illustrating a semiconductor device according to an embodiment of the present invention.

Referring to FIG. 1, there is illustrated a cross-sectional view of a semiconductor device 100 according to an embodiment of the present invention.

As illustrated in FIG. 1, the semiconductor device 100 comprises a semiconductor die 110, pillars 120 disposed perpendicular to one surface of the semiconductor die 110, a first insulating layer 130 surrounding the semiconductor die 110, an inner interconnection layer 140 formed along the outer surface of the first insulating layer 130 and electrically connected to the pillars 120, a second insulating layer 150 surrounding the inner interconnection layer 140, an outer interconnection layer 160 formed on the outer surface of the second insulating layer 150 and electrically connected to the inner interconnection layer 140, an outer insulating layer 170 surrounding the outer interconnection layer 160, and an electrically conductive metal layer 180 formed between portions of the outer insulating layer 170 on the outer interconnection layer 160.

The semiconductor die 110 has a plurality of devices therein to process electrical signals. The semiconductor die 110 is provided with a plurality of bond pads (not shown) on one surface thereof. The bond pads are metal electrodes that are exposed to the outside in order for the semiconductor die 110 to input and output signals.

The pillars 120 are disposed perpendicular to one surface of the semiconductor die 110. Specifically, the pillars 120 are disposed in a vertical direction with respect to the bond pads of the semiconductor die 110 so as to be electrically connected to the respective bond pads. That is, the number of the pillars 120 is the same as that of the bond pads. There is no restriction on the material for the pillars 120, but copper can be used to form the pillars 120.

The first insulating layer 130 is formed so as to surround the semiconductor die 110 and the pillars 120. The semiconductor die 110 is covered with the first insulating layer 130, but the pillars 120 may be exposed to the outside through the lower surface of the first insulating layer 130. A via hole 130a is formed so as to penetrate the first insulating layer 130. A metal can be applied to the first insulating layer 130 in a subsequent operation to achieve electrical interconnection through the via hole 130a.

The first insulating layer 130 can be formed of a prepreg. Prepreg is defined as a resin in a semi-cured state (B-stage) that is cured by heating. Specifically, the first insulating layer 130 can be formed by surrounding the semiconductor die 110 and the pillars 120 with a prepreg, followed by heat curing.

A well-known underfill material may be further used to form the first insulating layer 130. Specifically, an underfill material can be injected to fill gaps between the pillars 120, followed by curing. There is no restriction on the underfill material, but an epoxy resin is typically used as the underfill material.

The inner interconnection layer 140 is formed outside the first insulating layer 130. The inner interconnection layer 140 may be composed of a first interconnection layer 141 formed on the upper side of the first insulating layer 130, a second interconnection layer 142 formed on the lower side of the first insulating layer 130 and a third interconnection layer 143 formed along the inner wall of the via hole 130a.

A portion of the first interconnection layer 141 is interconnected to a portion of the second interconnection layer 142 by the third interconnection layer 143. The second interconnection layer 142 is electrically connected to the pillars 120. Due to this electrical connection, the semiconductor die 110 can input and output electrical signals through the pillars 120 and the second interconnection layer 142.

The second insulating layer 150 may be formed on the first insulating layer 130 to surround the inner interconnection layer 140. Further, the via hole 130a of the first insulating layer 130 may be filled with the second insulating layer 150.

The second insulating layer 150 can be formed of a prepreg. Specifically, the second insulating layer 150 is formed by the following procedure. First, a prepreg (i.e., a resin in a semi-cured state) is applied to the first insulating layer 130. Thereafter, a metal layer is formed on the prepreg and pressurized to form the outer interconnection layer 160, which is electrically connected to the inner interconnection layer 140. Finally, the prepreg is thermally cured to form the desired second insulating layer 150.

The outer interconnection layer 160 is formed on the second insulating layer 150 by patterning. The outer interconnection layer 160 may be composed of a first interconnection layer 161 and a second interconnection layer 162 formed on the upper and lower portions of the second insulating layer 150, respectively. Further, portions of the outer interconnection layer 160 can penetrate the second insulating layer 150 to be electrically connected to the underlying inner interconnection layer 140. The formation of the outer interconnection layer 160 has already been explained above. Portions of the outer interconnection layer 160 are exposed to the outside. Therefore, the semiconductor device 100 can send electrical signals to the outside and receive electrical signals from the outside through the exposed portions.

The outer insulating layer 170 is formed on the outer interconnection layer 160. Some portions of the outer interconnection layer 160 are covered with the outer insulating layer 170 but the other portions thereof are exposed to the outside. The outer insulating layer 170 is formed of an electrically insulating material. Accordingly, the outer interconnection layer 160 can be electrically connected to the outside only through the externally exposed portions of the outer insulating layer 170.

The bonding metal layer 180 may be formed on the outer interconnection layer 160. The bonding metal layer 180 is formed only on the exposed portions of the outer interconnection layer 160. The bonding metal layer 180 serves to facilitate subsequent bonding for electrical connection between the outer interconnection layer 160 and the outside. To this end, the bonding metal layer 180 may be formed of nickel/gold or nickel/palladium/gold. There is no restriction on the material for the bonding metal layer 180.

With this configuration of the semiconductor device 100, the semiconductor die 110 is electrically connected to the inner interconnection layer 140 through the pillars 120, thus eliminating the need for the formation of via holes, which is a typical step in the prior art. In addition, the pillars 120 are exposed to the outside of the first insulating layer 130 and their position is thus readily discernable, thus facilitating alignment of the semiconductor die 110 with the inner interconnection layer 140. Furthermore, based on the configuration of the semiconductor device 100 within which the semiconductor die 110 is mounted, the use of the semiconductor device 100 in a printed circuit board (PCB) facilitates the stacking of a plurality of semiconductor dies and can reduce the thickness required for the stack.

Hereinafter, the configuration of a semiconductor device 200 according to another embodiment of the present invention will be explained.

Figure 2:
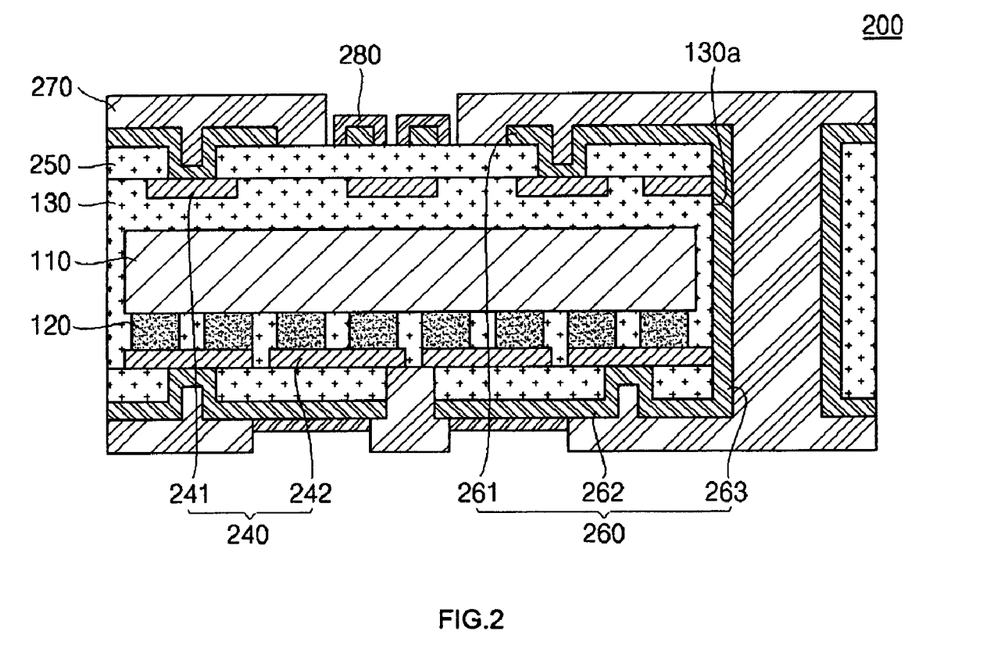
FIG. 2 is a cross-sectional view illustrating a semiconductor device according to another embodiment of the present invention.

Referring to FIG. 2, a cross-sectional view of the semiconductor device 200 is illustrated.

As illustrated in FIG. 2, the semiconductor device 200 comprises a semiconductor die 110, pillars 120, a first insulating layer 130, an inner interconnection layer 240 formed at the outer surface of the first insulating layer 130, a second insulating layer 250 surrounding the inner interconnection layer 240, an outer interconnection layer 260 formed outside the second insulating layer 250, an outer insulating layer 270 formed outside the outer interconnection layer 260, and a bonding metal layer 280 formed between portions of the outer insulating layer 270. The same reference numerals are used to designate elements having the same structure and function as the elements of the previous embodiment, and repeated explanation of such elements is omitted. Differences between this embodiment and the previous embodiment will be mainly discussed below.

The inner interconnection layer 240 is formed at the outer surface of the first insulating layer 130. The inner interconnection layer 240 may be composed of a first interconnection layer 241 and a second interconnection layer 242 formed at the upper and lower sides of the first insulating layer 130, respectively. The first interconnection layer 241 is indented, sometimes called embedded, to a depth equal to its thickness from the upper surface of the first insulating layer 130. The second interconnection layer 242 is indented to a depth equal to its thickness from the lower surface of the first insulating layer 130. As a result of the indentation, the lateral sides of the first interconnection layer 241 and the second interconnection layer 242 can be surrounded by the first insulating layer 130. Apart from this difference, the inner interconnection layer 240 has the same structure as the inner interconnection layer 140.

The second insulating layer 250 is formed on the inner interconnection layer 240. The second insulating layer 250 may be formed with a via hole on the same vertical line as a via hole 130a of the first insulating layer 130 so that the outer interconnection layer 260 formed on the second insulating layer 250 can penetrate the first insulating layer 130 and the second insulating layer 250. Apart from this difference, the second insulating layer 250 has the same structure as the second insulating layer 150.

The outer interconnection layer 260 is formed on the second insulating layer 250 by patterning. The outer interconnection layer 260 can penetrate the second insulating layer 250 to be electrically connected to the underlying inner interconnection layer 240.

The outer interconnection layer 260 may be composed of a first interconnection layer 261 formed on the upper side of the second insulating layer 250, a second interconnection layer 262 formed on the lower side of the second insulating layer 250 and a third interconnection layer 263 formed along the inner wall of the via hole. A portion of the first interconnection layer 261 is interconnected to a portion of the second interconnection layer 262 by the third interconnection layer 263. Apart from this difference, the outer interconnection layer 260 has the same structure as the outer interconnection layer 160.

The outer insulating layer 270 is formed on the outer interconnection layer 260. Some portions of the outer interconnection layer 260 are covered with the outer insulating layer 270 but the other portions thereof are exposed to the outside. The via holes of the first insulating layer 130 and the second insulating layer 250 are filled with the outer insulating layer 270. Apart from this difference, the outer insulating layer 270 has the same structure as the outer insulating layer 170.

The bonding metal layer 280 is formed only on the portions of the outer interconnection layer 260 exposed to the outside of the outer insulating layer 270. The bonding metal layer 280 has the same structure as the bonding metal layer 180.

With this configuration of the semiconductor device 200, the need for the formation of via holes, which is a typical step in the prior art, is eliminated. In addition, the semiconductor die 110 can be readily aligned with the inner interconnection layer 240. Furthermore, the use of the semiconductor device 200 in a printed circuit board (PCB) facilitates the stacking of a plurality of semiconductor dies and can reduce the thickness required for the stack.

Hereinafter, a method for fabricating the semiconductor device 100 will be explained.

Figure 3:
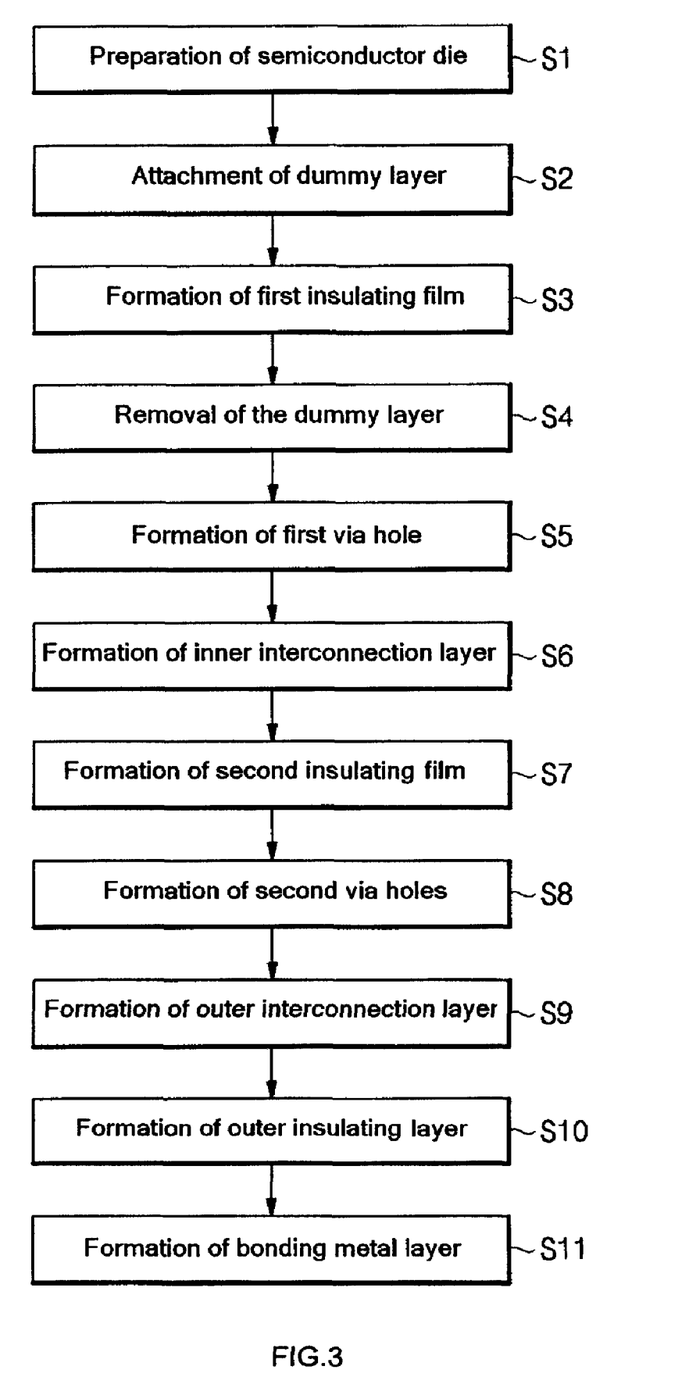
FIG. 3 is a flow chart illustrating a method for fabricating a semiconductor device according to an embodiment of the present invention.

Referring to FIG. 3, a flow chart of the method is illustrated. Referring to FIGS. 4A through 4K, cross-sectional views illustrating the method are illustrated.

As illustrated in FIG. 3, the method comprises the following operations: a preparation of semiconductor die operation (S1), an attachment of dummy layer operation (S2), a formation of first insulating film operation (S3), a removal of the dummy layer operation (S4), a formation of first via hole operation (S5), a formation of inner interconnection layer operation (S6), a formation of second insulating film operation (S7), a formation of second via holes operation (S8), a formation of outer interconnection layer operation (S9) and a formation of outer insulating layer operation (S10). The method may further comprise a formation of bonding metal layer operation (S11). The individual operations of FIG. 3 will be described with reference to FIGS. 4A through 4K.

Figure 4A:
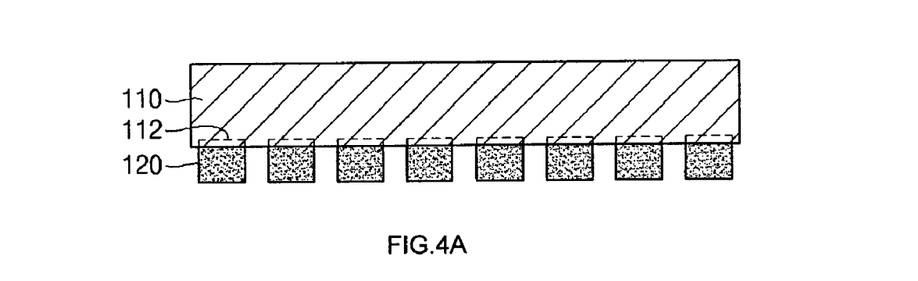
FIGS. 4A through 4K are cross-sectional views illustrating a method for fabricating a semiconductor device according to an embodiment of the present invention.

Referring to FIGS. 3 and 4A, in preparation of semiconductor die operation S1, a semiconductor die 110 is prepared. Pillars 120 are disposed perpendicular to one surface of the semiconductor die 110. The pillars 120 are opposed to bond pads 112 (bond pads 112 are not illustrated in the other figures from clarity of presentation) of the semiconductor die 110 and can be made of electrically conductive copper.

Figure 4B:
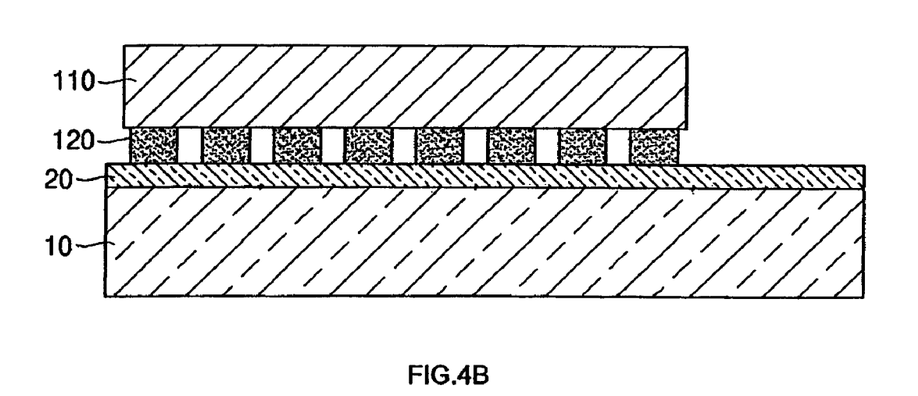

Referring to FIGS. 3 and 4B, in attachment of dummy layer operation S2, a dummy layer 10 is attached to the lower surfaces of the pillars 120 through a metal layer 20 formed thereon. The dummy layer 10 may be formed of copper or a resin. The metal layer 20 may be formed of copper. Although not shown, the pillars 120 and the metal layer 20 may be readily attached to each other through an intermediate solder or tin layer.

Figure 4C:
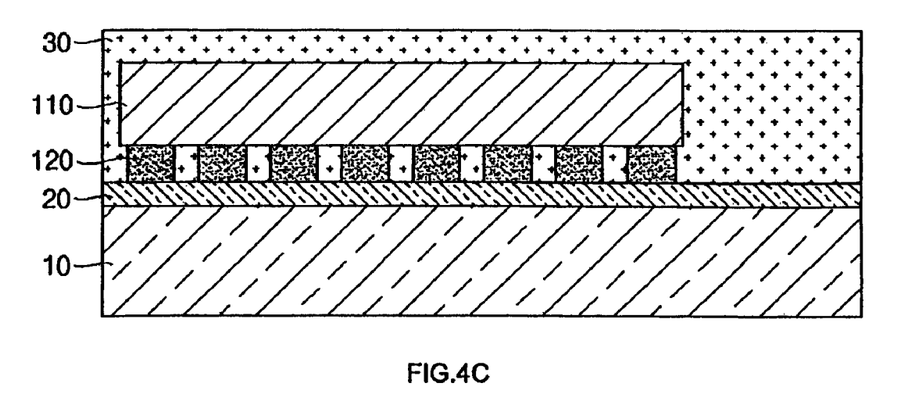

Referring to FIGS. 3 and 4C, in formation of first insulating film operation S3, a first insulating film 30 is formed so as to surround the semiconductor die 110 and the pillars 120.

The first insulating film 30 can be formed of a prepreg. Specifically, the first insulating film 30 is formed by applying a prepreg to the semiconductor die 110 and the pillars 120, followed by heat curing to surround the semiconductor die 110 and the pillars 120.

A well-known underfill injection process may be additionally carried out to fill gaps between the pillars 120.

Figure 4D:
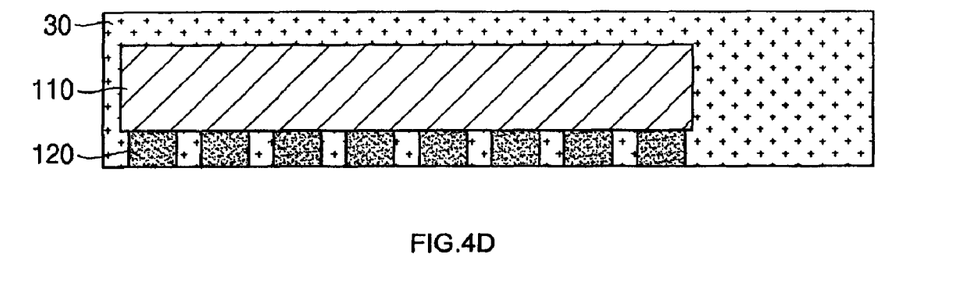

Referring to FIGS. 3 and 4D, in removal of the dummy layer operation S4, the dummy layer 10 and the metal layer 20 are removed. The removal of the dummy layer 10 and the metal layer 20 can be achieved by etching. In the case where an intermediate solder or tin layer is interposed between the pillars 120 and the metal layer 20, the intermediate layer can be used as an etching barrier. By the removal of the dummy layer, the pillars 120 can be exposed to the lower surface of the first insulating film 30.

Figure 4E:
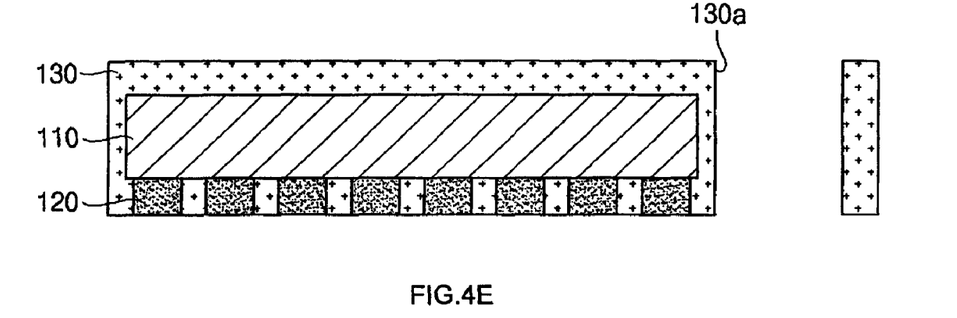

Referring to FIGS. 3 and 4E, in formation of first via hole operation S5, the first insulating film 30 is drilled using a laser or mechanical drill to form a first via hole 130a. The drilling of the first insulating film 30 leaves a first insulating layer 130, which is used in a semiconductor device according to an embodiment of the present invention. The first via hole 130a facilitates connection between upper and lower inner metal layers, which will be formed in a subsequent operation.

Figure 4F:
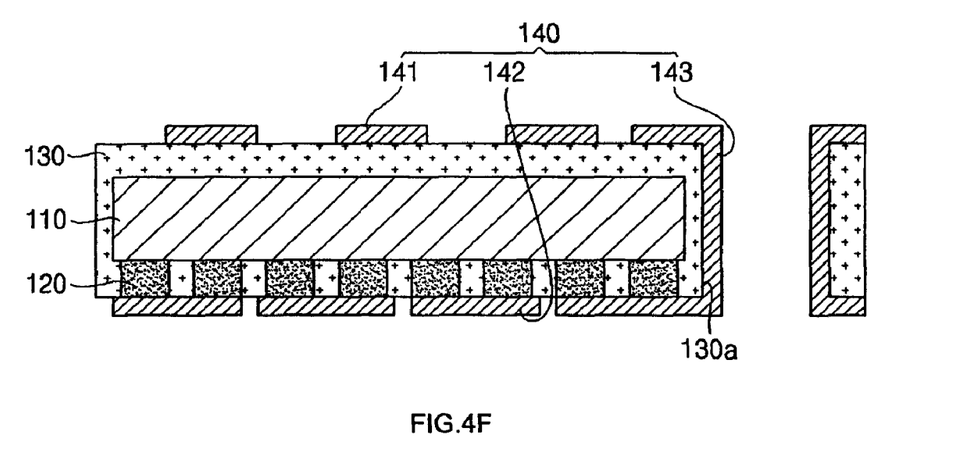

Referring to FIGS. 3 and 4F, in formation of inner interconnection layer operation S6, an inner interconnection layer 140 is formed outside the first insulating layer 130. The inner interconnection layer 140 may be formed by electro- or electroless plating with a suitable metal, such as copper, silver or aluminum. The inner interconnection layer 140 may be composed of a first interconnection layer 141, a second interconnection layer 142, and a third interconnection layer 143 formed along the inner wall of the via hole 130a to connect the first interconnection layer 141 and the second interconnection layer 142.

Figure 4G:
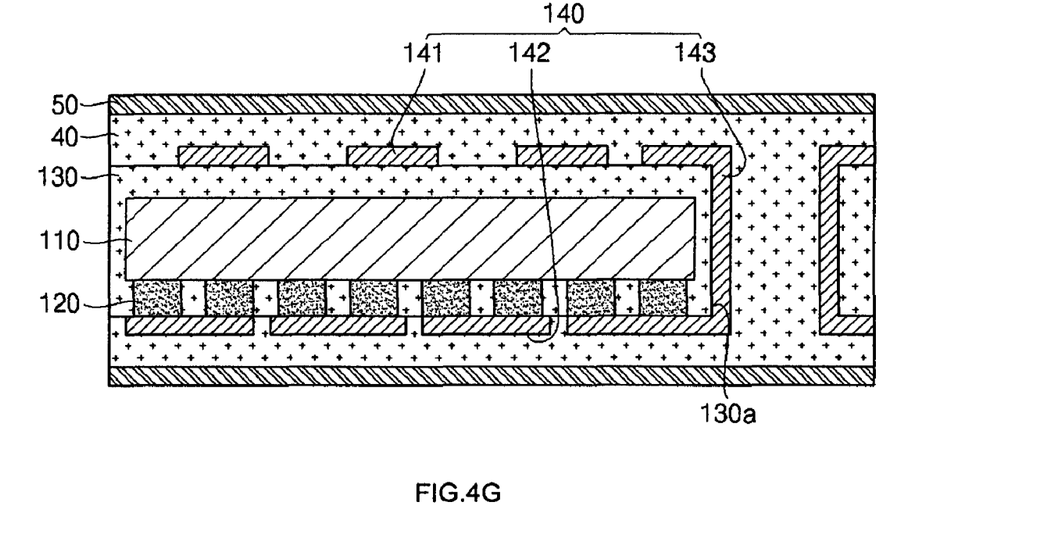

Referring to FIGS. 3 and 4G, in formation of second insulating film operation S7, a second insulating film 40 is formed so as to surround the inner interconnection layer 140 and a metal layer 50 is formed outside the second insulating film 40. The second insulating film 40 can be formed of a prepreg and the metal layer 50 can be formed of a suitable metal, such as copper, silver or aluminum.

Figure 4H:
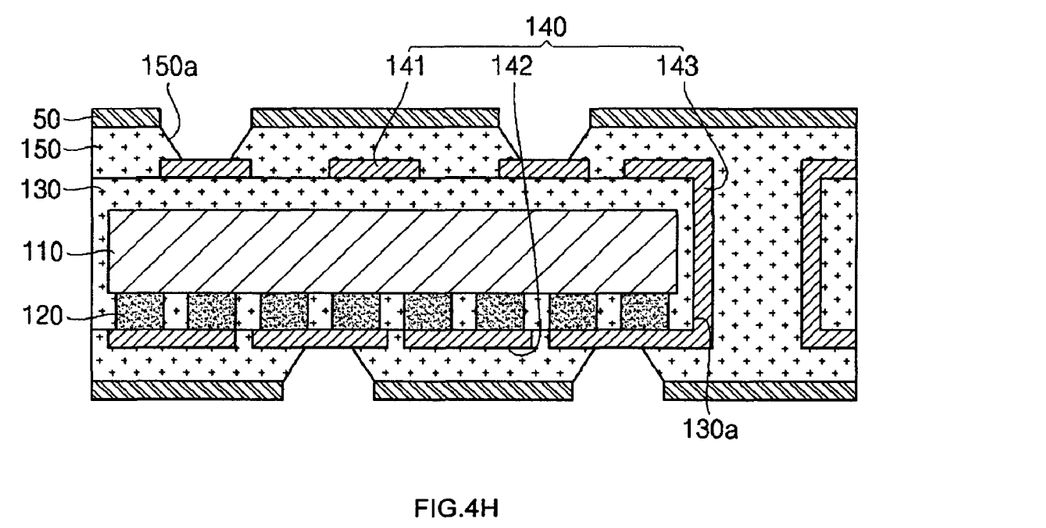

Referring to FIGS. 3 and 4H, in formation of second via holes operation S8, the second insulating film 40 and the metal layer 50 are drilled to form second via holes 150a. This drilling leaves a second insulating layer 150. As a result of the drilling, portions of the first interconnection layer 141 and the second interconnection layer 142 are exposed to the outside through the second via holes 150a, and therefore, the inner interconnection layer 140 can be electrically connected to an outer interconnection layer, which will be formed in a subsequent operation.

Figure 4I:
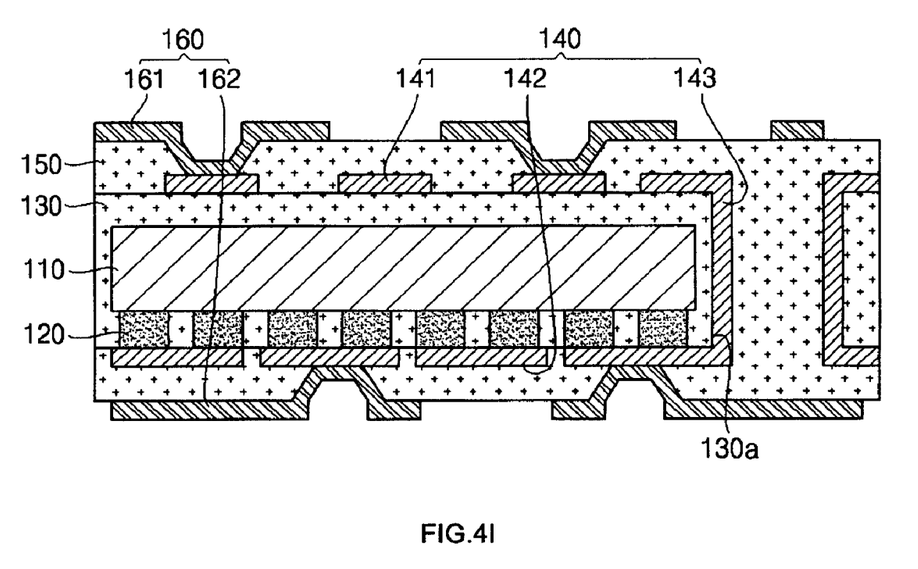

Referring to FIGS. 3 and 4I, in formation of outer interconnection layer operation S9, a metal is plated on the second insulating layer 150 and patterned to form an outer interconnection layer 160. Metal layer 50 (FIG. 4H) may or may not be removed prior to the plating of the metal. The patterning of the metal can be achieved by a conventional photolithographic process. Specifically, the outer interconnection layer 160 can be formed by plating a metal on the second insulating layer 150, applying a photoresist to the metal, exposing the photoresist, followed by developing and etching. If needed, the metal can be formed by a lift-off process. At this time, the outer interconnection layer 160 can fill the second via holes 150a of the second insulating layer 150. This filling provides electrical connection between the outer interconnection layer 160 and the inner interconnection layer 140.

Figure 4J:
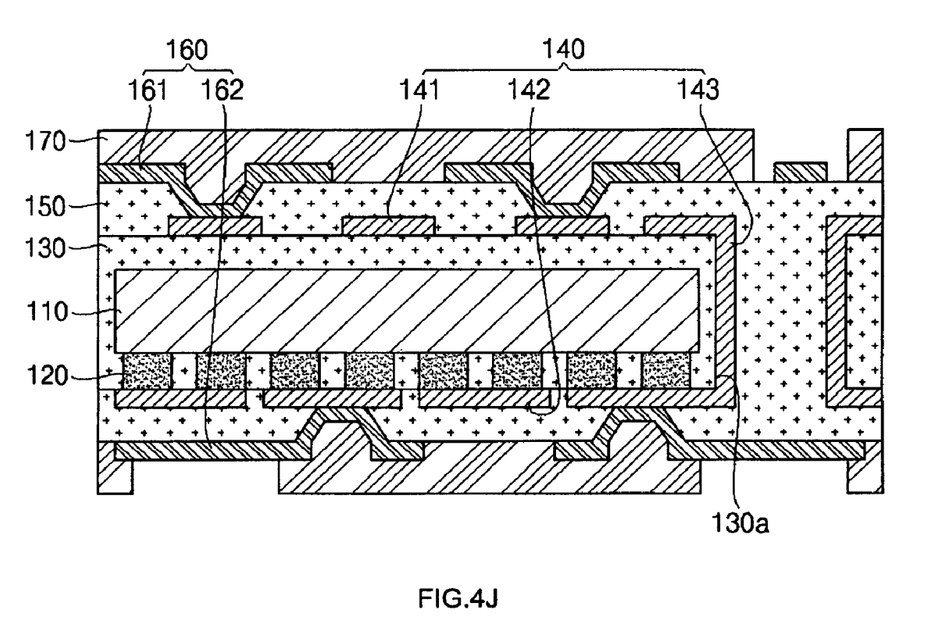

Referring to FIGS. 3 and 4J, in formation of outer insulating layer operation S10, an outer insulating layer 170 is formed on the outer interconnection layer 160. Specifically, the outer insulating layer 170 is formed by applying an insulating material over the entire surface of the outer interconnection layer 160 and exposing portions of the outer interconnection layer 160 by patterning. This patterning enables connection between the semiconductor device 100 and external circuits through the exposed portions of the outer interconnection layer 160, so that the semiconductor device 100 can input and output electrical signals.

Figure 4K:
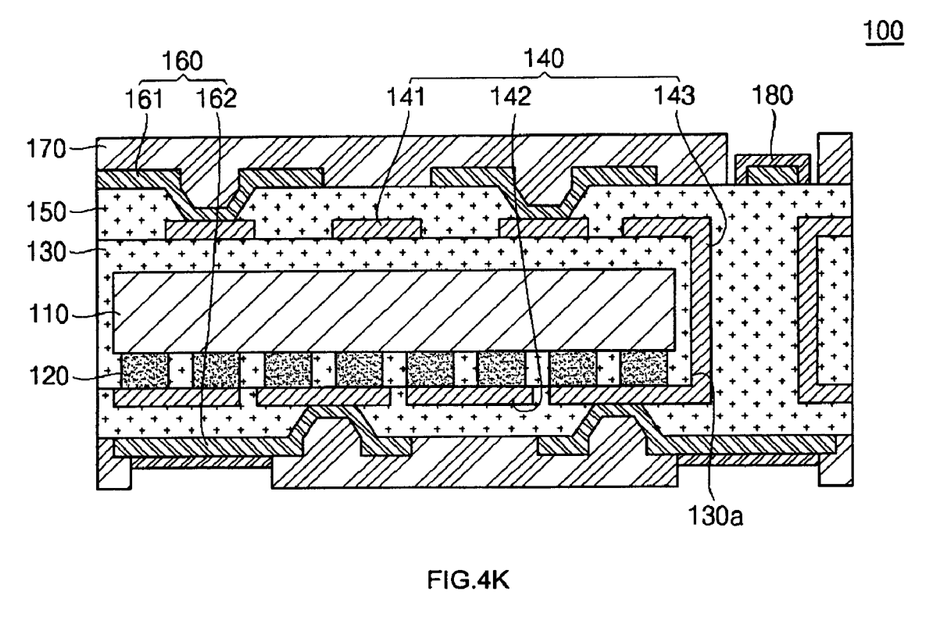

Referring to FIGS. 3 and 4K, in formation of bonding metal layer operation S11, a bonding metal layer 180 is formed on the exposed portions of the outer interconnection layer 160. The bonding metal layer 180 may be formed of nickel/gold or nickel/palladium/gold. The bonding metal layer 180 serves to facilitate subsequent bonding for the connection of the exposed portions of the outer interconnection layer 160 and external circuits.

Hereinafter, a method for fabricating the semiconductor device 200 will be explained.

Figure 5:
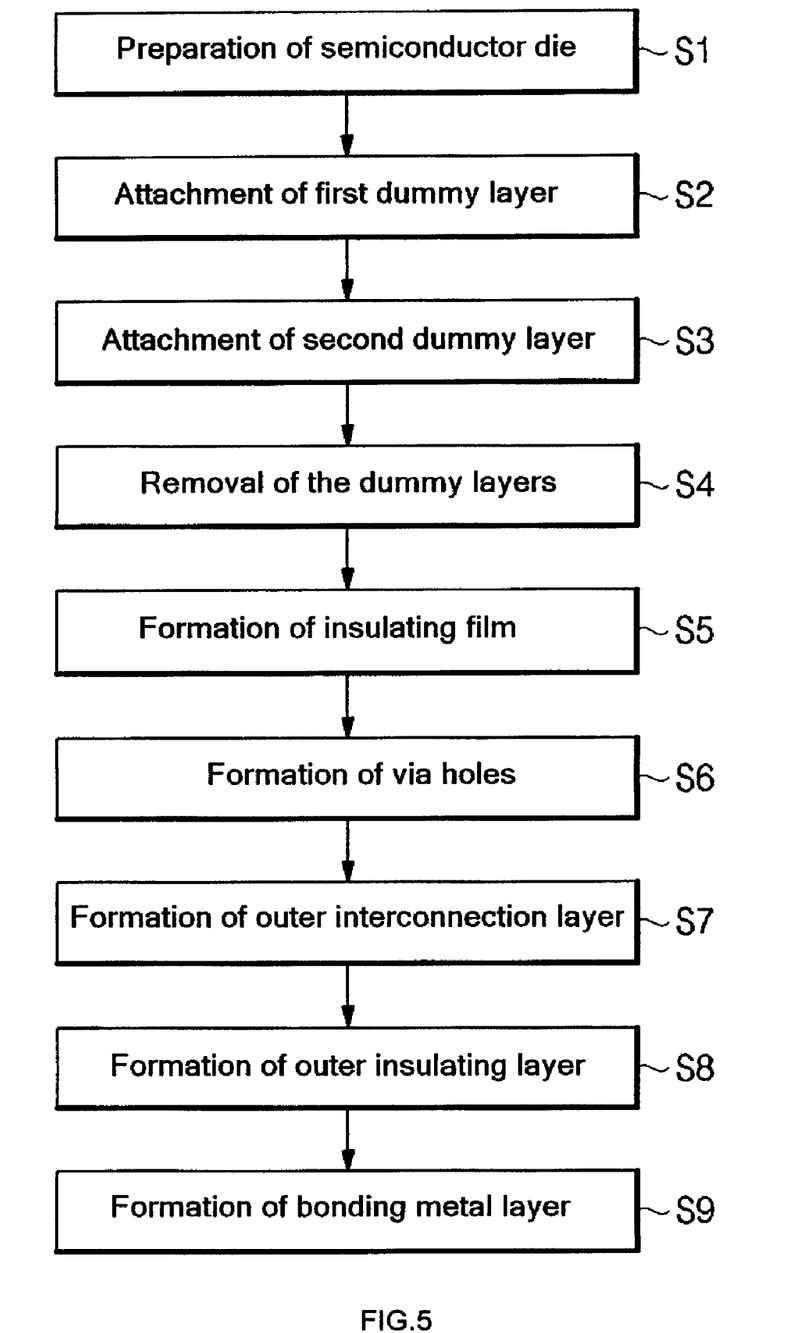
FIG. 5 is a flow chart illustrating a method for fabricating a semiconductor device according to another embodiment of the present invention.

Referring to FIG. 5, a flow chart of the method is illustrated. Referring to FIGS. 6A through 6I, cross-sectional views illustrating the method are illustrated.

As illustrated in FIG. 5, the method comprises the following operations: a preparation of semiconductor die operation (S1), an attachment of first dummy layer operation (S2), an attachment of second dummy layer operation (S3), a removal of the dummy layers operation (S4), a formation of insulating film operation (S5), a formation of via holes operation (S6), a formation of outer interconnection layer operation (S7), and a formation of outer insulating layer operation (S8). The method may further comprise a formation of bonding metal layer operation (S9). The individual operations of FIG. 5 will be described with reference to FIGS. 6A through 6I.

Figure 6A:
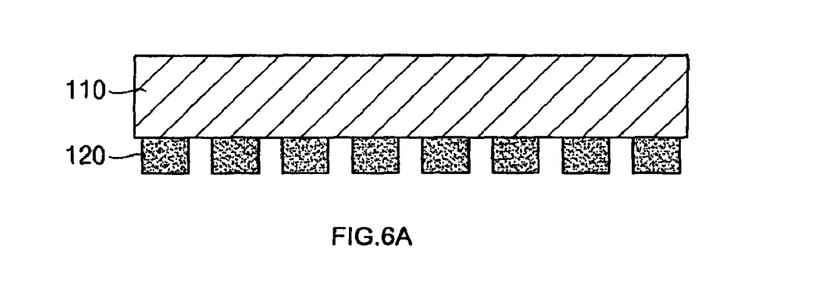
FIGS. 6A through 6I are cross-sectional views illustrating a method for fabricating a semiconductor device according to another embodiment of the present invention.

Referring to FIGS. 5 and 6A, in preparation of semiconductor die operation S1, a semiconductor die 110 is prepared. Pillars 120 are disposed perpendicular to one surface of the semiconductor die 110. The pillars 120 are opposed to bond pads of the semiconductor die 110 and can be made of electrically conductive copper.

Figure 6B:
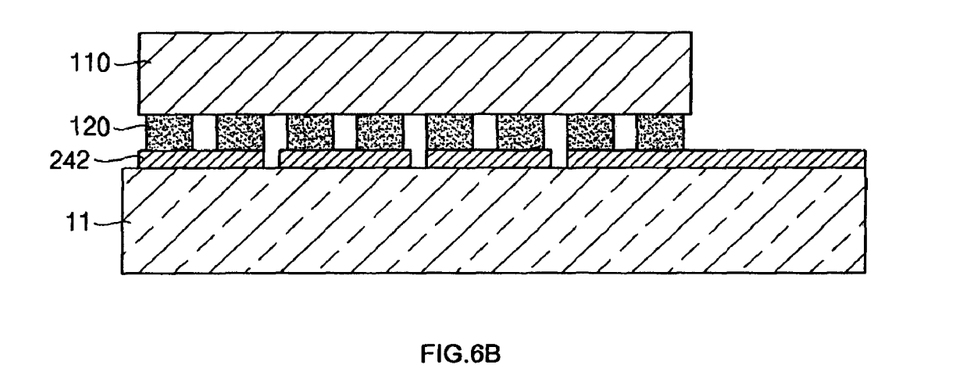

Referring to FIGS. 5 and 6B, in attachment of first dummy layer operation S2, a first dummy layer 11 is attached to the lower surfaces of the pillars 120 through a second interconnection layer 242 formed thereon.

Figure 6C:
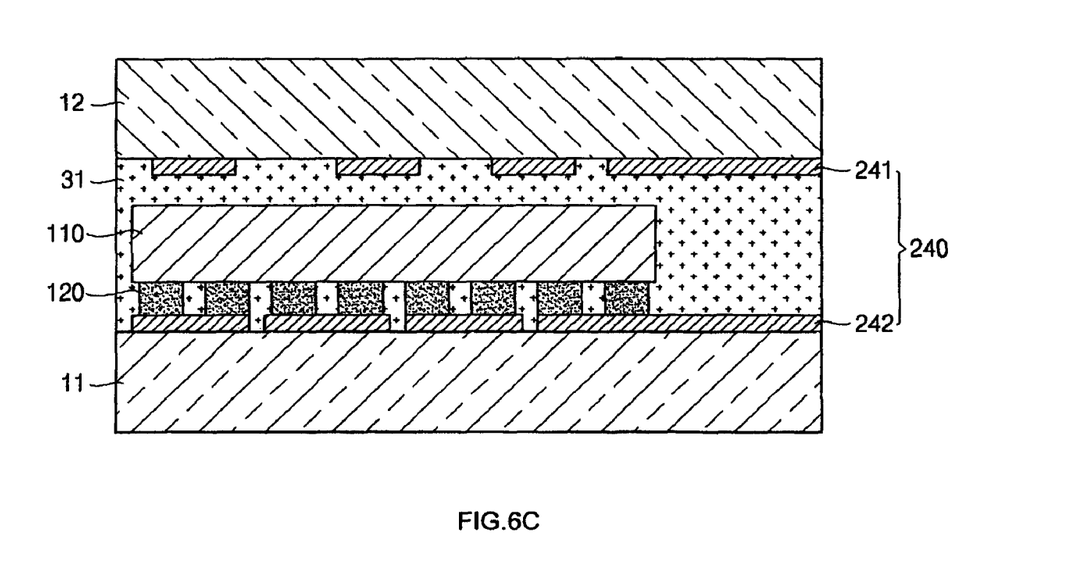

Referring to FIGS. 5 and 6C, in attachment of second dummy layer operation S3, a first insulating film 31, sometimes called a first insulating layer 31, is formed so as to surround the semiconductor die 110, the pillars 120 and the second interconnection layer 242, and a second dummy layer 12 is attached on the first insulating film 31. The first insulating film 31 can be formed of a prepreg. Gaps between the pillars 120 can be filled with an underfill material of the first insulating layer 31. The second dummy layer 12 is attached on the first insulating film 31, and at the same time, a first interconnection layer 241 as an inner interconnection layer formed under the second dummy layer 12 is formed on the first insulating film 31. At this time, since the first insulating film 31 is formed of a prepreg (i.e., a resin in a semi-cured state), the first interconnection layer 241 can be indented into the first insulating film 31.

Figure 6D:
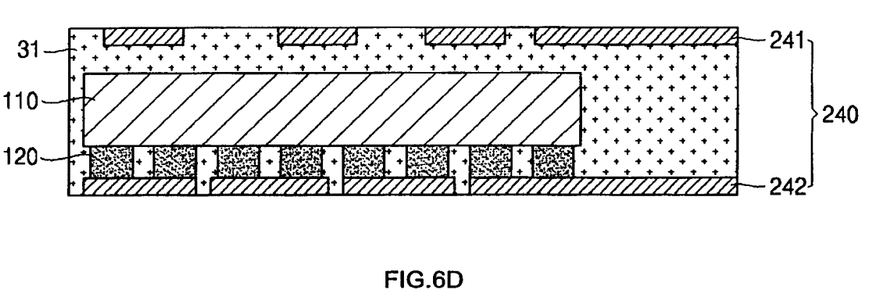

Referring to FIGS. 5 and 6D, in removal of the dummy layers operation S4, the first dummy layer 11 and the second dummy layer 12 are removed by etching. As a result of the etching, the first interconnection layer 241 and the second interconnection layer 242 of the inner interconnection layer 240 can be exposed through the upper and lower surfaces of the first insulating film 31.

Figure 6E:
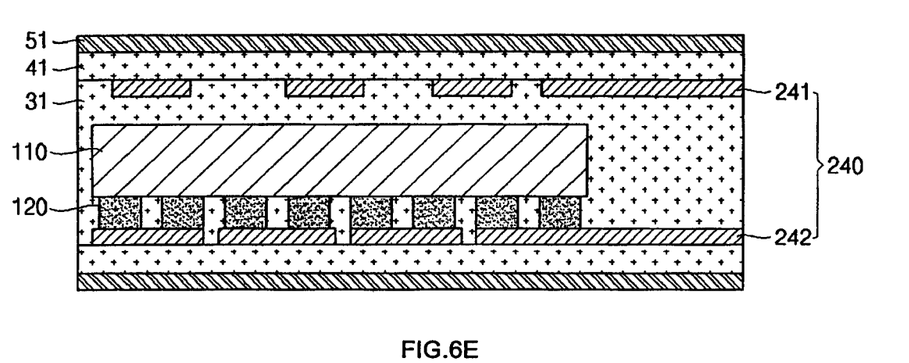

Referring to FIGS. 5 and 6E, in formation of insulating film operation S5, a second insulating film 41 and a metal layer 51 are sequentially formed outside the first insulating film 31. The second insulating film 41 may be formed of a prepreg or a typical insulating material.

Figure 6F:
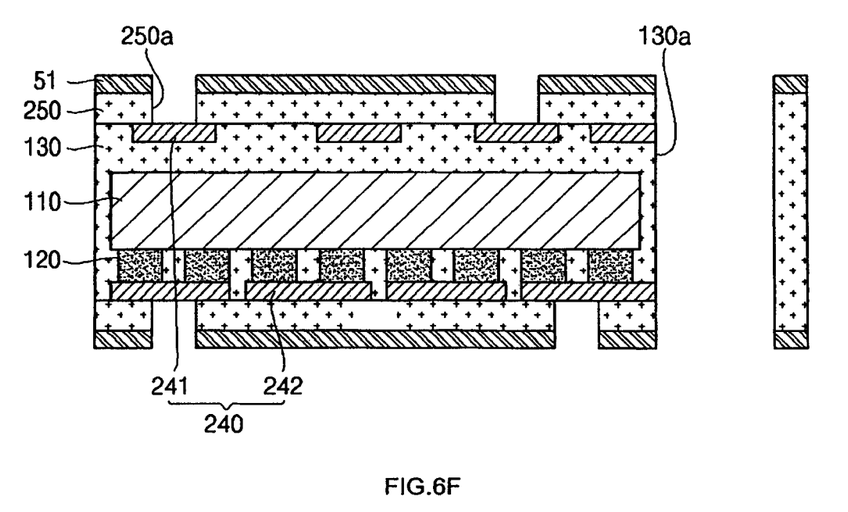

Referring to FIGS. 5 and 6F, in formation of via holes operation S6, the second insulating film 41 and the metal layer 51 are processed using a laser drill to form a first via hole 130a and second via holes 250a. The first via hole 130a is formed to penetrate the first insulating film 130. The second via holes 250a are formed by processing the metal layer 51 and the second insulating film 41 using a laser drill, thus leaving a second insulating layer 250. Portions of the inner interconnection layer 240 are exposed to the outside through the second via holes 250a.

Figure 6G:
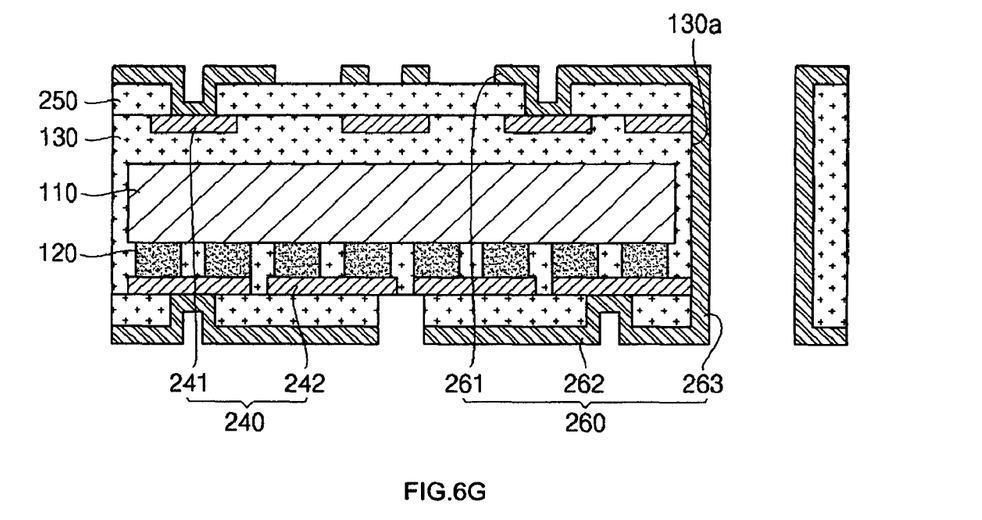

Referring to FIGS. 5 and 6G, in formation of outer interconnection layer operation S7, an outer interconnection layer 260 is formed on the second insulating layer 250. Specifically, the outer interconnection layer 260 is formed along the outer surface of the second insulating layer 250. The outer interconnection layer 260 may be composed of a first interconnection layer 261 and a second interconnection layer 262 formed on the upper and lower surfaces of the second insulating layer 250, respectively, to be electrically connected to the inner interconnection layer 240. The outer interconnection layer 260 may further include a third interconnection layer 263 formed along the via hole 130a to electrically interconnect a portion of the first interconnection layer 261 and a portion of the second interconnection layer 262.

Figure 6H:
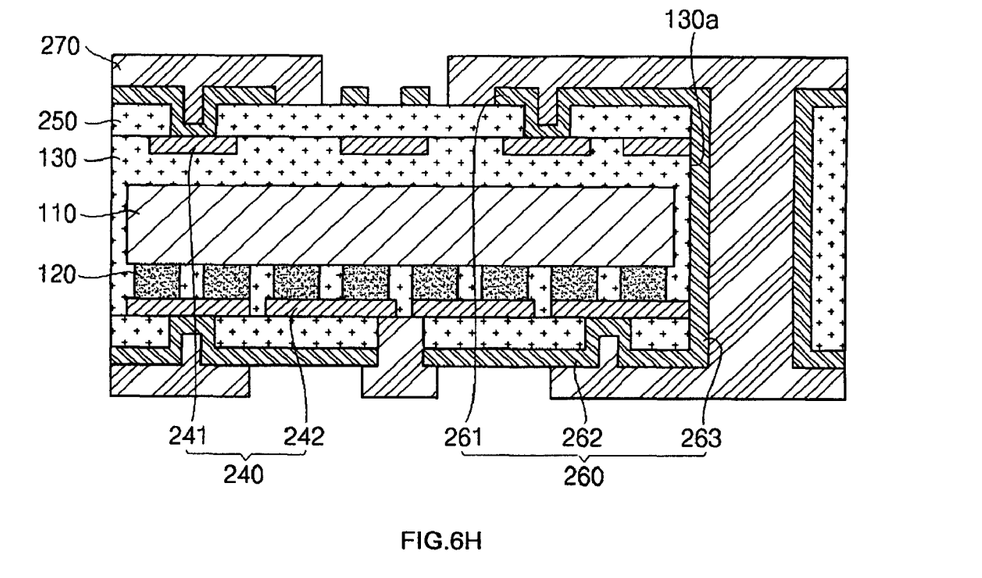

Referring to FIGS. 5 and 6H, in formation of outer insulating layer operation S8, an outer insulating layer 270 is formed on the outer interconnection layer 260. Some portions of the outer interconnection layer 260 are surrounded by the outer insulating layer 270 but the other portions thereof are exposed to the outside. The exposed portions of the outer interconnection layer 260 are electrically connected to external circuits.

Figure 6I:
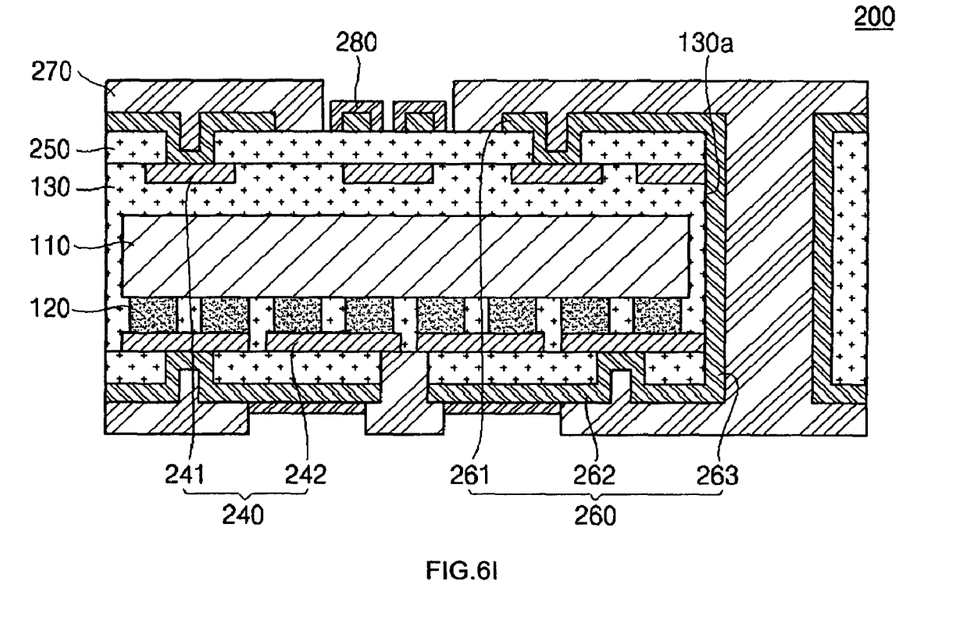

Referring to FIGS. 5 and 6I, in formation of bonding metal layer operation S9, a bonding metal layer 280 is formed on the exposed portions of the outer interconnection layer 260. The bonding metal layer 280 may be formed of gold or nickel. The bonding metal layer 280 serves to facilitate subsequent bonding for the connection of the outer interconnection layer 260 and external circuits.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process, may be implemented by one skilled in the art in view of this disclosure.

What is claimed is:

1. A semiconductor device comprising:
a semiconductor die having a plurality of bond pads;
pillars disposed perpendicular to and electrically connected to the bond pads;
an integral first insulating layer surrounding and directly contacting and covering the entire semiconductor die including an inactive surface, sides, and an active surface of the semiconductor die, the first insulating layer filling gaps between the pillars;

an inner interconnection layer surrounding the first insulating layer and electrically connected to the pillars, the inner interconnection layer comprising:
  a first interconnection layer formed directly on an upper side of the first insulating layer; and
  a second interconnection layer formed directly on a lower side of the first insulating layer;
a second insulating layer surrounding the first insulating layer and the inner interconnection layer;
an outer interconnection layer formed directly on the second insulating layer, the outer interconnection layer penetrating the second insulating layer to directly contact and be electrically connected to the inner interconnection layer;
an outer insulating layer surrounding the outer interconnection layer, wherein exposed portions of the outer interconnection layer and exposed portions of the second insulating layer are exposed from the outer insulating layer; and
a bonding metal layer formed on the exposed portions of the outer interconnection layer, the bonding metal layer directly contacting the exposed portions of the second insulating layer.

2. The semiconductor device of claim 1, further comprising an intermediate layer formed between the pillars and the inner interconnection layer, the intermediate layer being selected from the group consisting of a solder intermediate layer and a tin intermediate layer.

3. The semiconductor device of claim 1 wherein a number of the pillars is the same as a number of the bond pads.

4. The semiconductor device of claim 1, further comprising a via hole penetrating the first insulating layer.

5. The semiconductor device of claim 4, wherein the inner interconnection layer extends along an inner wall of the via hole.

6. The semiconductor device of claim 4, wherein the via hole is filled with the second insulating layer.

7. The semiconductor device of claim 1, further comprising:
  a via hole penetrating the first insulating layer, wherein the inner interconnection layer further comprises:
  a third interconnection layer formed along an inner wall of the via hole, the third interconnection layer interconnecting the first interconnection layer with the second interconnection layer.

8. The semiconductor device of claim 1, wherein the bonding metal layer is selected from the group consisting of a nickel/gold layer and a nickel/palladium/gold layer.

9. A semiconductor device comprising:
a semiconductor die having a plurality of bond pads;
pillars disposed perpendicular to and electrically connected to the bond pads;
an integral first insulating layer surrounding and directly contacting and covering the entire semiconductor die including an inactive surface, sides, and an active surface of the semiconductor die, the first insulating layer filling gaps between the pillars;
an inner interconnection layer embedded into the first insulating layer and electrically connected to the pillars, the inner interconnection layer comprising:
  a first interconnection layer embedded into an upper side of the first insulating layer; and
  a second interconnection layer embedded into a lower side of the first insulating layer;
a second insulating layer surrounding the first insulating layer and the inner interconnection layer;
an outer interconnection layer formed directly on the second insulating layer, the outer interconnection layer penetrating the second insulating layer to directly contact and be electrically connected to the inner interconnection layer;
an outer insulating layer surrounding the outer interconnection layer, wherein exposed portions of the outer interconnection layer and exposed portions of the second insulating layer are exposed from the outer insulating layer; and
a bonding metal layer formed on the exposed portions of the outer interconnection layer, the bonding metal layer directly contacting the exposed portions of the second insulating layer.

10. The semiconductor device of claim 9, further comprising an intermediate layer formed between the pillars and the inner interconnection layer, the intermediate layer being selected from the group consisting of a solder intermediate layer and a tin intermediate layer.

11. The semiconductor device of claim 9 wherein a number of the pillars is the same as a number of the bond pads.

12. The semiconductor device of claim 9, further comprising a via hole penetrating the first insulating layer and the second insulating layer.

13. The semiconductor device of claim 12, wherein the outer interconnection layer extends along an inner wall of the via hole.

14. The semiconductor device of claim 13, wherein the via hole is filled with the outer insulating layer.

15. The semiconductor device of claim 12, wherein the outer interconnection layer comprises:
  a first interconnection layer formed on an upper side of the second insulating layer;
  a second interconnection layer formed on a lower side of the second insulating layer; and
  a third interconnection layer formed along an inner wall of the via hole, the third interconnection layer interconnecting the first interconnection layer of the outer interconnection layer with the second interconnection layer of the outer interconnection layer.

16. A semiconductor device comprising:
a semiconductor die comprising bond pads;
pillars coupled to the bond pads;
an integral first insulating layer directly contacting and covering the entire semiconductor die including an inactive surface, sides, and an active surface of the semiconductor die, the first insulating layer being coupled to the pillars;
an inner interconnection layer coupled to the first insulating layer and the pillars, the inner interconnection layer comprising:
  a first interconnection layer directly on an upper side of the first insulating layer; and
  a second interconnection layer directly on a lower side of the first insulating layer;
a second insulating layer coupled to the first insulating layer and the inner interconnection layer;
an outer interconnection layer directly on the second insulating layer, the outer interconnection layer penetrating the second insulating layer to directly contact and be electrically connected to the inner interconnection layer;
an outer insulating layer coupled to the outer interconnection layer, wherein exposed portions of the outer interconnection layer and exposed portions of the second insulating layer are exposed from the outer insulating layer; and
a bonding metal layer formed on the exposed portions of the outer interconnection layer, the bonding metal layer directly contacting the exposed portions of the second insulating layer.

* * * * *